Figure 1:
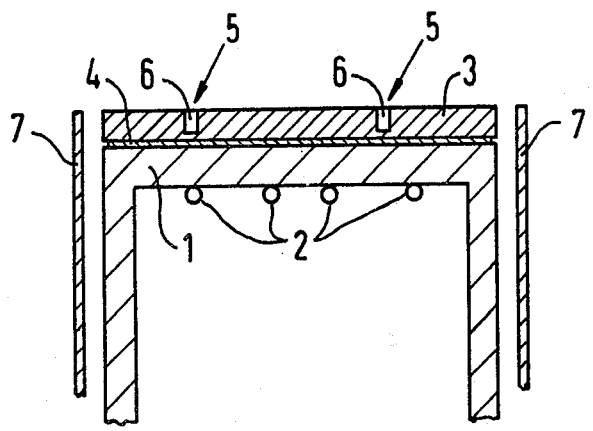

United States Patent [19] [11] 4,430,190
Eilers et al. [45] Feb. 7, 1984

[54] DEVICE FOR CATHODE SPUTTERING OF AT LEAST TWO DIFFERENT MATERIALS

[75] Inventors: Carl-Ernst Eilers, Heidenheim; Horst Pachonik, Taufkirchen, both of Fed. Rep. of Germany

[73] Assignee: Siemens Aktiengesellschaft, Berlin & Munich, Fed. Rep. of Germany

[21] Appl. No.: 448,220

[22] Filed: Dec. 9, 1982

[30] Foreign Application Priority Data

Dec. 16, 1981 [DE] Fed. Rep. of Germany ....... 3149910

[51] Int. Cl.³ ............................................. C23C 15/00
[52] U.S. Cl. ................................. 204/298; 204/192 R
[58] Field of Search .......................................... 204/298

[56] References Cited

U.S. PATENT DOCUMENTS

| 4,013,533 | 3/1977 | Choen-solal et al. | 204/298 |
| 4,132,614 | 1/1979 | Cuomo et al. | 204/298 |
| 4,275,126 | 6/1981 | Bergmann et al. | 204/298 |
| 4,350,578 | 9/1982 | Friser et al. | 204/298 |
| 4,352,974 | 10/1982 | Mizutani et al. | 204/298 |

FOREIGN PATENT DOCUMENTS

| 2350322 | 4/1975 | Fed. Rep. of Germany | 204/298 |
| 2940369 | 5/1981 | Fed. Rep. of Germany | 204/298 |

OTHER PUBLICATIONS

Gambino et al., IBM Technical Disclosure Bulletin, vol. 22, No. 3, Aug. 1979, pp. 1228–1229.

*Primary Examiner*—Arthur P. Demers
*Attorney, Agent, or Firm*—Herbert L. Lerner; Laurence A. Greenberg

[57] ABSTRACT

Device for cathode sputtering of at least two different materials, including a holder, a device for cooling the holder, a heat-conducting layer disposed on the holder, a target being connected to the holder with the heat-conducting layer disposed therebetween, the target being formed of one of the materials to be sputtered and the target having a plurality of blind holes formed therein, and pins formed of another material to be admixed in the sputtering being fitted in at least one of the blind holes.

4 Claims, 2 Drawing Figures

DEVICE FOR CATHODE SPUTTERING OF AT LEAST TWO DIFFERENT MATERIALS

The invention relates to a device for cathode sputtering of at least two different materials, wherein a target formed of the materials to be sputtered is connected to a holder with the interposition of a heat-conducting layer, and wherein the holder is provided with a cooling device.

In apparatus of this type for cathode sputtering, the material (for example, metals, alloys, oxides and all other substances suitable for sputtering), i.e. the "target", is connected with the potential of the cathode, and is sputtered by bombardment with ions of a noble gas. In many applications, where thin layers are to be deposited, for example, such as electrode coating, or even as semiconductor and insulating material, pure substances cannot be used and it is rather necessary to use certain alloys or mixtures or doped substances. In these cases, the targets are made of the corresponding basic materials, and in particular by producing alloys or by mixing. This method is time and cost intensive, and involves great expenses if the composition of the layer is to be changed. It is accordingly an object of the invention to provide a device for cathode sputtering of at least two different materials, which overcomes the hereinforementioned disadvantages of the heretofore-known devices of this general type, and in which the composition of the layers which are to be deposited by sputtering can be varied in a simple manner.

With the foregoing and other objects there is provided, in accordance with the invention, a device for cathode sputtering of at least two different materials, comprising a holder, means for cooling said holder, a heat conducting layer disposed on said holder, a target being connected to said holder with said heat-conducting layer disposed therebetween, said target being formed of one of the materials to be sputtered and said target having a plurality of blind holes formed therein, and pins formed of another material to be admixed or added in the sputtering being fitted in at least some or a part of said blind holes.

The device according to the invention has the advantage of making it easy to change the composition of the layers which are deposited by sputtering, by simply varying the number of the inserted pins. Because of the small cross section of the pins, the heat conduction (heat carried away) through the point contacts with the target, does not create any problems. It serves the purpose of the invention to construct the target from base material, and to distribute the blind holes uniformly over the target. It is not necessary for all of the blind holes to be filled with the respective pins of different material, rather it it permissible to have empty blind holes on the target. This makes it possible to further simplify the manufacturing process of the target, because the same holes with the same cross section can always be provided at the same places.

Since the pressures at cathode sputtering are relatively high ($10^{-2}$ to $10^{-4}$ mbar), a good mixing of the participating metals takes place in the gas space, if the surface onto which the material layer is to be deposited (sputtered) is spaced away by a distance which is several times the free path length of the sputtering atoms or molecules, respectively. For example, the free path length is about 0.6 cm at a pressure of $10^{-2}$ mbar.

In accordance with another feature of the invention, the target is screwed to the holder and the heat conducting medium or layer between the target and the holder is a heat conducting paste, a metal powder or a metal foil.

The advantage of being able to simply and quickly connect the target itself with the holder is therefore obtained, so that a target change can be made without losses in time or cost. It therefore becomes possible to perform many coating processes for which sputtering was not used heretofore because the costs were too high.

Other features which are considered as characteristics for the invention are set forth in the appended claims.

Although the invention is illustrated and described herein as embodied in a device for cathode sputtering of at least two different materials, it is nevertheless not intended to be limited to the details shown, since various modifications and structural changes may be made therein without departing from the spirit of the invention and within the scope and range of equivalents of the claims.

Figure 2:
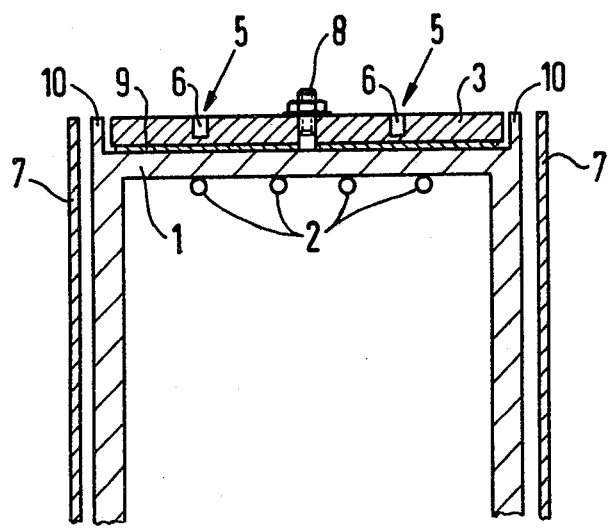

The construction and method of operation of the invention, however, together with additional objects and advantages thereof will be best understood from the following description of specific embodiments when read in connection with the accompanying drawings, in which:

FIG. 1 is a fragmentary, diagrammatic, cross-sectional view of a device with the target soldered in place; and FIG. 2 is a view similar to FIG. 1, of a device with the target held in place by screws.

Referring now to the figures of the drawing and first particularly to FIG. 1 thereof, there is seen a holder 1 which is provided with tubes 2 for water cooling. A target 3 is soldered or bonded to the target holder 1 by a layer 4 formed of an alloy with a low melting point. In order to provide a bond with good heat conduction, it is sufficient for about 60% of the target surface to be connected with the holder 1 through the bonding layer 4.

In the target there are blind holes 5, into which pins or small plugs 6 of another material are fitted. The number of pins 6 required for the layers to be sputtered can be easily determined from the local discharge intensity and the ratio of the specific materials to be sputtered off. The purpose of the invention is thereby served if the target 3 is formed of a material which is to be predominantly contained in the sputtered layer. The number and the material of the pins 6 in this case determine the composition of the layer which is sputtered on.

A dark-space shield or screen 7 is disposed alongside the holder 1. In FIG. 2 another embodiment is shown, wherein the target 3 is connected with the holder 1 by a screw 8. This version makes the exchanging of the target very easy.

To obtain favorable heat conduction for carrying off heat between the target 3 and the holder 1, a layer 9 is disposed between the two parts. The layer 9 is formed either of a heat conducting paste, a metal powder or a metal foil. The heat is then carried off by means of a cooling device, in which the cooling tubes are disposed at the lower surface of the holder 1 for the water cooling.

It is advantageous if the heat conducting paste contains organic and/or silicon compounds which are difficult to decompose thermically. It must therefore be made certain that only cooled zones are treated with the paste, because otherwise the danger exists of vapor traces of the coolant entering the sputtering region.

If the heat conducting layer 9 is formed of a metal powder (preferably copper, aluminum, bronze or brass), the grain size of the metal powder should be equal to or larger than 5 $\mu$m in practice. This avoids smearing or flying dust, which could cause short circuits between the cathode and the dark field or space shielding 7 (the target 3 is connected to the potential of the cathode). If the metal powder is uniformly distributed, the heat transfer between the target 3 and the holder 1, is just as good as with the target which is soldered on.

According to another embodiment, the heat conducting layer 9 is formed of a metal foil, which is preferably welded in a double layer at its edges. Before the metal foil is closed by welding, a small amount of gas-free heat-conducting paste is filled into the hollow formed by the foil so that a very thin cushion of any given shape is formed such as with holes for accommodating screws. The surface of this cushion adapts itself exactly to the shape of the target and the holder, and provides a bridge with good heat conductivity due to its content. For this purpose, on one hand the metal foils must be very thin, so that they can adjust themselves sufficiently to the surface, while on the other hand the foils must be strong enough to withstand the pressure of the target 3 without tearing. Therefore, it is advantageous to use copper or copper alloys of about 50 $\mu$m thickness, because of its ductility and good welding property.

When using the simple screw technique, it becomes possible to provide a rim 10 on the holder 1. This rim 10 is the same height or slightly higher than the target 3. This rim 10 can be smoothly polished, so that no electrical discharges can occur from the rim of the target 3 to the dark space shielding 7 due to the increased field strength at craters or points. The rim 10 makes the application of the heat-conducting layer 9 especially easy.

The foregoing is a description corresponding to German Application P 31 49 910.4, dated Dec. 16, 1981, the International Priority of which is claimed for the instant application and which is hereby made part of this application. Any discrepancies between the foregoing specification and the afore-mentioned corresponding German application are to be resolved in favor of the latter.

There are claimed:

1. Device for cathode sputtering of at least two different materials comprising a holder, means for cooling said holder, a heat-conducting layer disposed on said holder, a target connected to said holder with said heat-conducting layer disposed therebetween, said target being exchangeably screwed to said holder said target being formed of one of the materials to be sputtered and having a plurality of blind holes formed therein, and pins formed of another material to be admixed in the sputtering being fitted in at least some of said blind holes.

2. Device according to claim 1, wherein said heat-conducting layer between said target and said holder is a heat-conducting paste.

3. Device according to claim 1, wherein said heat-conducting layer between said target and said holder is a metal powder.

4. Device according to claim 1, wherein said heat-conducting layer between said target and said holder is a metal foil.

* * * * *